(12) United States Patent
Komiyama et al.

(10) Patent No.: US 11,225,166 B2
(45) Date of Patent: Jan. 18, 2022

(54) CONTROL DEVICE AND METHOD FOR DISCHARGING A RECHARGEABLE BATTERY

(71) Applicant: TOYOTA MOTOR EUROPE, Brussels (BE)

(72) Inventors: Keita Komiyama, Evere (BE); Yuki Katoh, Brussels (BE)

(73) Assignee: TOYOTA MOTOR EUROPE, Brussels (BE)

(*) Notice: Subject to any disclaimer, the term of this patent is extended or adjusted under 35 U.S.C. 154(b) by 551 days.

(21) Appl. No.: 16/070,905

(22) PCT Filed: Feb. 2, 2016

(86) PCT No.: PCT/EP2016/052192
§ 371 (c)(1),
(2) Date: Jul. 18, 2018

(87) PCT Pub. No.: WO2017/133760
PCT Pub. Date: Aug. 10, 2017

(65) Prior Publication Data
US 2019/0020209 A1 Jan. 17, 2019

(51) Int. Cl.
*H02J 7/00* (2006.01)
*B60L 58/13* (2019.01)
(Continued)

(52) U.S. Cl.
CPC ........... *B60L 58/13* (2019.02); *B60L 58/14* (2019.02); *G01R 31/3648* (2013.01);
(Continued)

(58) Field of Classification Search
CPC ...... H02J 7/0031; H02J 7/0047; H02J 7/0063; H02J 2310/48; H02J 7/0029; H02J 7/0021;
(Continued)

(56) References Cited

U.S. PATENT DOCUMENTS

2012/0293131 A1* 11/2012 Nakamura ............ H01M 10/42
320/134
2014/0177145 A1* 6/2014 Kawahara ........... H01M 10/482
361/679.01
(Continued)

FOREIGN PATENT DOCUMENTS

EP 1 422 769 A1 5/2004
JP 2004-095400 A 3/2004
(Continued)

OTHER PUBLICATIONS

Translation of Oct. 29, 2019 Office Action issued in Japanese Patent Application No. 2018-558477.
(Continued)

*Primary Examiner* — Richard Isla
*Assistant Examiner* — Mohammed J Sharief
(74) *Attorney, Agent, or Firm* — Oliff PLC

(57) ABSTRACT

A control device for controlling discharging of a rechargeable battery, the control device comprising a rechargeable dummy cell, a first circuit configured to discharge the battery and the dummy cell, and a second circuit configured to measure the open circuit voltage of the dummy cell. The control device is configured to: determine the open circuit voltage of the dummy cell by using the second circuit, and determine the maximum capacity decrement of the battery, which is to be discharged until full discharging, based on the determined open circuit voltage of the dummy cell. The invention also refers to a corresponding method of controlling discharging of a rechargeable battery.

27 Claims, 5 Drawing Sheets

(51) Int. Cl.
*H01M 10/48* (2006.01)
*B60L 58/14* (2019.01)
*G01R 31/392* (2019.01)
*G01R 31/396* (2019.01)
*G01R 31/36* (2020.01)

(52) U.S. Cl.
CPC ......... *G01R 31/392* (2019.01); *G01R 31/396* (2019.01); *H01M 10/486* (2013.01); *H02J 7/0021* (2013.01); *H02J 7/0029* (2013.01); *H02J 7/0047* (2013.01); *H02J 7/0063* (2013.01); *B60L 2240/547* (2013.01); *H01M 2220/20* (2013.01); *H02J 7/0048* (2020.01); *H02J 7/0049* (2020.01); *H02J 7/00302* (2020.01); *H02J 7/00306* (2020.01); *H02J 2007/0067* (2013.01); *Y02T 10/70* (2013.01)

(58) Field of Classification Search
CPC .. H02J 7/00306; H02J 7/00302; H02J 7/0049; H02J 7/0048; H02J 2007/0067; H02J 7/1423; Y02E 60/12; G01R 31/3648; G01R 31/396; G01R 31/392; H01M 10/48; H01M 10/486; H01M 2220/20; H01M 10/44; Y02T 10/7044; Y02T 10/7005; Y02T 10/705; B60L 58/13; B60L 58/14; B60L 58/12; B60L 2240/547
USPC ......................................................... 320/136
See application file for complete search history.

(56) References Cited

U.S. PATENT DOCUMENTS

| | | | | |
|---|---|---|---|---|
| 2014/0214347 | A1* | 7/2014 | Laskowsky | G01R 31/3842 702/63 |
| 2015/0369869 | A1* | 12/2015 | Ku | G01R 31/3835 324/427 |
| 2016/0252585 | A1* | 9/2016 | Baba | H01M 10/48 702/63 |
| 2016/0268651 | A1* | 9/2016 | Arai | H02J 7/0049 |
| 2017/0033572 | A1* | 2/2017 | Becker | G01R 31/367 |
| 2017/0098021 | A1* | 4/2017 | He | G06F 30/20 |

FOREIGN PATENT DOCUMENTS

| | | | |
|---|---|---|---|
| JP | 2005-106747 A | 4/2005 | |
| JP | 2007-220658 A | 8/2007 | |
| JP | 2010-273413 A | 12/2010 | |
| JP | 2011-115031 A | 6/2011 | |
| JP | 2012-054019 A | 3/2012 | |
| JP | 2013-096803 A | 5/2013 | |
| JP | 2015-158416 A | 9/2015 | |
| WO | 2015/011534 A2 | 1/2015 | |
| WO | WO-2015011534 A3 * | 7/2015 | ............. B60L 58/12 |

OTHER PUBLICATIONS

Translation of Feb. 12, 2020 Office Action issued in Japanese Patent Application No. 2018-558477.
Nov. 24, 2020 Office Action issued in Chinese Patent Application No. 201680080284.7.

* cited by examiner

CONTROL DEVICE AND METHOD FOR DISCHARGING A RECHARGEABLE BATTERY

FIELD OF THE DISCLOSURE

The present disclosure is related to a control device for controlling discharging of a rechargeable battery and also to a method of discharging of a rechargeable battery.

BACKGROUND OF THE DISCLOSURE

Rechargeable batteries, also called secondary cells, have become increasingly important as energy storages, in particular for vehicles. Such vehicles may be hybrid vehicles comprising an internal combustion engine and one or more electric motors or purely electrically driven vehicles. When the vehicle is driven by electrical power, the battery is discharged.

A suitable rechargeable battery for such a vehicle may be a solid-state bipolar battery or other, e.g. liquid type batteries, in particular a laminated Li-ion battery. The rechargeable battery may be realized by a single cell or it may include a set of preferably identical cells. In the latter case the battery is also called a battery pack.

A relevant characteristic of a battery is its capacity. A battery's capacity is the amount of electric charge it can deliver at a rated voltage. The more electrode material contained in the battery the greater is its capacity. The capacity is measured in units such as amp-hour (A·h).

The battery or the battery pack may include a control device for controlling charging and/or discharging. The control device monitors state of charge (SOC) of the battery and it shall avoid the battery from operating outside its safe operating area. Such a battery or battery pack is also called smart battery/smart battery pack. It is also possible that the control device is provided by the vehicle.

One important aspect of charge/discharge control is to assure that any overcharging and/or over-discharging of the battery is avoided. For this purpose the battery voltage may be monitored, which is increasing during charging and decreasing during discharging. In case the determined battery voltage falls under a predetermined lower voltage limit during discharging, it is recognized by the control device that the battery is fully discharged and discharging is stopped.

However, during the lifetime of a battery the charging and discharging procedures may lead to a degradation of the laminated layers of the battery. In particular the laminated electrodes may be affected by the degradation. The degradation leads to increased resistance which in turn decreases the measured voltage of the battery during discharging.

As a result, when discharging a battery with lamination degradation, the measured voltage reaches the predetermined upper voltage limit sooner, and the control device erroneously recognizes that the battery is fully discharged. Although the battery is actually not yet fully discharged (not at the lower limit of allowed SOC range), discharging is finished. This means that the available amount of energy decreases due to the degradation dispersion.

EP 1 422 769 (A1) discloses a laminated stack type battery with unit cell voltage measurement tabs. A plurality of unit cells stacked in a stack direction are connected in series and shared voltage measurement tab electrodes are formed on the plurality of unit cells, respectively, in order measure voltages for the plurality of unit cells.

However, in the above technology for each cell a single voltage measurement tab electrode is needed. In case of a battery with several hundred cells, such a sensor arrangement can become very expensive or even impossible to be realized.

SUMMARY OF THE DISCLOSURE

Currently, it remains desirable to provide a control device which provides a reliable and economic discharging control function and which is suitable for different battery types.

Therefore, according to embodiments of the present disclosure, a control device is provided for controlling discharging of a rechargeable battery. The control device comprises:
 a rechargeable dummy cell,
 a first circuit configured to discharge the battery and the dummy cell, and
 a second circuit configured to measure the open circuit voltage of the dummy cell.
The control device is configured to:
 determine the open circuit voltage of the dummy cell by using the second circuit, and
 determine the maximum capacity decrement of the battery based on the determined open circuit voltage of the dummy cell.

By providing such a configuration it is possible to control discharging based on capacity monitoring of the battery. For this purpose a dummy cell is used which is configured such that it permits determining a maximum capacity decrement of the battery. Said maximum capacity decrement of the battery is preferably the maximum dischargeable capacity decrement. More particularly, the maximum capacity decrement is preferably that amount of capacity, which still remains to be discharged until the battery is fully discharged, advantageously the lower limit of its state of charge (SOC) using range.

Accordingly "fully discharged" does not mean that the battery is physically fully discharged, i.e. 0% SOC, what could harm the battery and is therefore to be avoided. The lower limit of the allowed SOC range may be chosen such that the battery can be discharged to a maximum extent without risking any dangerous discharging and low voltage of the battery.

The dummy cell allows measuring the open circuit voltage more precisely than it could be done at the battery. Hence, also the maximum capacity decrement of the battery can be determined more precisely. The dummy cell may consist of one single secondary (i.e. rechargeable) cell. It may be included in the battery (in particular if the battery is realized as a battery pack comprising a plurality of cells). Basically, the design parameters (as e.g. the cell capacity, the degradation rate or the cell type, etc.) may be same between the dummy cell and the battery. In particular, in case the battery is realized as a battery pack comprising a plurality of cells, the dummy cell may be of the same type as such a cell of the battery. The dummy cell may be configured only for supporting controlling charging/discharging of the rechargeable battery but not for driving the vehicle, in particular with regard to its stored electrical power. However, it may be charged and discharged in correspondence to the battery.

The capacity of a battery is the amount of electric charge it can deliver at a rated voltage. The capacity is measured in units such as amp-hour (A·h). The maximum capacity decrement of the battery according to the disclosure represents the amount of electric charge which can be discharged, when discharging is started. Hence, in case the state of charge SOC is e.g. 70% when charging is started and discharging has to be stopped at 10%, the maximum capacity decrement of the battery corresponds to 60%. The maximum capacity decrement of the battery may also be referred to as the Depth of Discharge (DOD) of the battery, which is the complement of SOC: as the one increases, the other decreases. The DOD may also be expressed in Ah.

The open circuit voltage is the difference of electrical potential between two terminals of a device, i.e. between the two terminals of the dummy cell, when disconnected from any circuit, in particular the first circuit according to the disclosure. Hence, there is no external load connected, such that no external electric current flows between the terminals.

The control device and the procedure performed by the control device are suitable for all types of solid-state bipolar batteries. However, the control device may also be applied to other battery types, like liquid type batteries, as e.g. Li-ion battery.

The control device may further be configured to:
discharge the battery and the dummy cell by using the first circuit,
monitor the current capacity decrement of the battery which has been discharged, and
stop discharging, when the current capacity decrement of the battery exceeds the determined maximum capacity decrement.

Accordingly, the control device is able to reliably discharge the battery based on the determined maximum capacity decrement, until the battery is fully discharged.

Alternatively or additionally the control device may be configured to:
monitor the voltage of the battery during discharging of the battery, and
stop discharging, when the voltage falls below a predetermined lower voltage limit.

Accordingly, the predetermined lower voltage limit may be chosen such that the battery can be discharged to a maximum extent without risking any dangerous discharging and low voltage of the battery. This predetermined lower voltage limit may be determined based on the degradation of the battery. It may correspond to a second predetermined lower voltage limit and may be smaller than a first predetermined lower voltage limit. The first predetermined lower voltage limit may correspond to a conventional predetermined lower voltage limit known from the prior art, which corresponds to a lower SOC usage range of a new battery and does not take into account any degradation.

The control device may further be configured to determine, whether the battery is charged during discharging. If this is the case, the control device is preferably further configured to re-determine the open circuit voltage of the dummy cell by using the second circuit and to re-determine the maximum capacity decrement of the battery based on the re-determined open circuit voltage.

In this way the control device may be configured to consider a charging of the battery which may happen at the same time, as the battery is discharged. For instance, when the vehicle is driven by the internal combustion engine, the battery may be discharged. In case the vehicle is a hybrid vehicle, the battery may be charged at the same time by the electric power generated by the internal combustion engine. The control device may be configured to control charging and/or discharging of the battery.

The control device may further be configured to determine the current capacity decrement of the battery based on the discharging current and discharging time of the battery, and/or based on the open circuit voltage of the dummy cell.

In other words, by integrating the current over time, the capacity of the battery may be calculated. Alternatively or additionally the capacity may be determined based on the open circuit voltage of the dummy cell. The current capacity decrement may be measured while the battery is discharging provided that the measurement is based on the discharging current and discharging time of the battery. In case the system uses measuring the voltage of the dummy cell, the discharging may stop shortly in order to measure the current capacity decrement.

The control device may be configured determine the state of charge of the dummy cell based on the determined open circuit voltage of the dummy cell, and in particular based on a predetermined SOC-OCV mapping. Hence, the control device may be provided with a predetermined SOC-OCV mapping, e.g. a SOC-OCV curve, in which it may look up the SOC value, which corresponds to the measured OCV value.

The control device may be configured determine the maximum capacity decrement based on the determined state of charge of the dummy cell. In other words, the maximum capacity decrement of the battery may be determined based on the determined state of charge of the dummy cell, which itself has been determined based on the determined open circuit voltage of the dummy cell.

The predetermined SOC-OCV mapping may be updated based on a determined degradation of the dummy cell. Accordingly, said SOC-OCV mapping may be predetermined before the first charging of the dummy cell. It may further be updated during the discharging procedures. Consequently, the maximum capacity decrement of the battery may be determined based on the determined open circuit voltage of the dummy cell and the degradation of the of the dummy cell.

The degradation of the dummy cell may be determined based on a temperature/frequency distribution of the dummy cell and a predetermined degradation rate of the dummy cell.

The determination of the degradation of the dummy cell may be based on the Arrhenius equation.

The temperature/frequency distribution of the dummy cell may be determined by recording for each temperature of the dummy cell how much time the dummy cell had this temperature during its lifetime.

In other words, the temperature data of the dummy cell may be collected during the life time of the dummy cell, i.e. during its usage and the rests between usages. The temperature/frequency distribution may be established by accumulating for each temperature the dummy cell had during its past life time, how long the dummy cell had this temperature. For this reason it is advantageous that the dummy cell has the same age, i.e. lifetime, like the battery. In other words, the dummy cell is advantageously replaced, when the battery is replaced.

The control device may further be configured to determine the state of charge of the battery based on the determined state of charge of the dummy cell and in particular based on a predetermined mapping between the state of charge of the battery and the state of charge of the dummy cell. For example the control device may look-up in a predetermined look-up table, i.e. the predetermined mapping, the state of charge of the battery which matches to the determined state of charge of the dummy cell. In other words the relationship between the state of charge of the battery and the determined state of charge of the dummy cell may be predetermined and may hence be known to the control device. In one example, the dummy cell may continuously have a state of charge which corresponds to that one of the battery.

The control device may moreover be configured to determine the maximum capacity decrement based on the state of charge of the battery. Hence, the relationship between the maximum capacity decrement and the determined state of charge of the battery may be calculated by the control device. In other words, the maximum capacity decrement of the battery may be determined based on the determined state of charge of the battery, which itself has been determined based on the determined state of charge of the dummy cell, which itself has been determined based on the determined open circuit voltage of the dummy cell and the determined degradation of the dummy cell.

The control device may be configured to control discharging of a battery of a specific battery type comprising a predetermined degradation rate, wherein the dummy cell may have a degradation rate which correlates with the degradation rate of the battery, and which in particular may be the same degradation rate. Accordingly, the dummy cell may also be a rechargeable battery. The dummy cell is preferably chosen such that, based on its measured characteristics, the characteristics of the battery can be determined. In particular, the dummy cell is chosen such that, based on its determined degradation rate, the degradation rate of the battery and hence also a suitable maximum capacity decrement of the battery can be determined.

Moreover, the battery of the specific battery type preferably comprises a predetermined capacity, wherein the dummy cell may have a capacity which correlates with the capacity of the battery. For example, in case the battery is a battery pack comprising a plurality of cells, the dummy cell may have the same capacity as such a cell. Furthermore, the dummy cell may be of the same type as such a dummy cell. Accordingly, the dummy cell is chosen such that, based on its state of charge, the state of charge of the battery and hence also a suitable maximum capacity decrement of the battery can be determined. For example, if the vehicle uses the battery between SOC20% and SOC80%, the dummy cell may have the capacity which is equivalent to this range, i.e. may also have a range between SOC20% and SOC80%.

Preferably, the control device may comprise a voltage sensor for detecting the open circuit voltage of the dummy cell. The control device may comprise a further voltage sensor for detecting the voltage and/or the state of charge of the battery.

The control device may comprise a temperature sensor for detecting the temperature of the dummy cell and/or the battery.

The disclosure further relates to a battery pack. The battery pack may comprise at least one battery, in particular a solid state bipolar battery, and a control device as described above.

The disclosure further relates to a battery charging system. Said battery charging system may comprise at least one battery, in particular a solid state bipolar battery, a discharging device for the battery, and a control device as described above.

According to a further aspect the disclosure relates to a vehicle comprising an electric motor and a battery pack, as described above.

Alternatively the vehicle may comprise an electric motor, at least one battery, in particular a solid state bipolar battery, and in addition a control device, as described above.

Moreover the disclosure relates to a method of controlling discharging of a rechargeable battery. A first circuit is used to discharge the battery and a rechargeable dummy cell, and a second circuit is used to measure the open circuit voltage of the dummy cell. The method comprises the steps of:
  determining the open circuit voltage of the dummy cell by using the second circuit, and
  determining the maximum capacity decrement of the battery based on the determined open circuit voltage of the dummy cell.

The method may further comprise the steps of:
  discharging the battery and the dummy cell by using the first circuit,
  monitoring the current capacity decrement of the battery which has been discharged, and
  stopping discharging, when the current capacity decrement of the battery exceeds the determined maximum capacity decrement.

Alternatively or additionally the method may comprise the steps of:
  monitoring the voltage of the battery during discharging of the battery, and
  stopping discharging, when the voltage falls below a predetermined lower voltage limit.

The method may further comprise the steps of: determining, whether the battery is charged during discharging, and if yes, re-determining the open circuit voltage of the dummy cell and the maximum capacity decrement of the battery.

The current capacity decrement of the battery may be determined based on the discharging current and discharging time of the battery, and/or based on the open circuit voltage of the dummy cell.

The state of charge of the dummy cell may be determined based on the determined open circuit voltage of the dummy cell, and in particular based on a predetermined SOC-OCV mapping.

The maximum capacity decrement may be determined based on the determined state of charge of the dummy cell.

The predetermined SOC-OCV mapping is preferably updated based on a determined degradation of the dummy cell.

The degradation of the battery may be determined based on a temperature/frequency distribution of the dummy cell and a predetermined degradation rate of the dummy cell.

The determination of the degradation of the dummy cell may be based on the Arrhenius equation.

The temperature/frequency distribution of the dummy cell may be determined by recording for each temperature of the dummy cell how much time the dummy cell had this temperature during its lifetime.

The state of charge of the battery may be determined based on the determined state of charge of the dummy cell and in particular based on a predetermined mapping between the state of charge of the battery and the state of charge of the dummy cell. The maximum capacity decrement may be determined based on the state of charge of the battery.

The accompanying drawings, which are incorporated in and constitute a part of this specification, illustrate embodiments of the disclosure and together with the description, serve to explain the principles thereof.

DESCRIPTION OF THE EMBODIMENTS

Reference will now be made in detail to exemplary embodiments of the disclosure, examples of which are illustrated in the accompanying drawings. Wherever possible, the same reference numbers will be used throughout the drawings to refer to the same or like parts.

Figure 1:
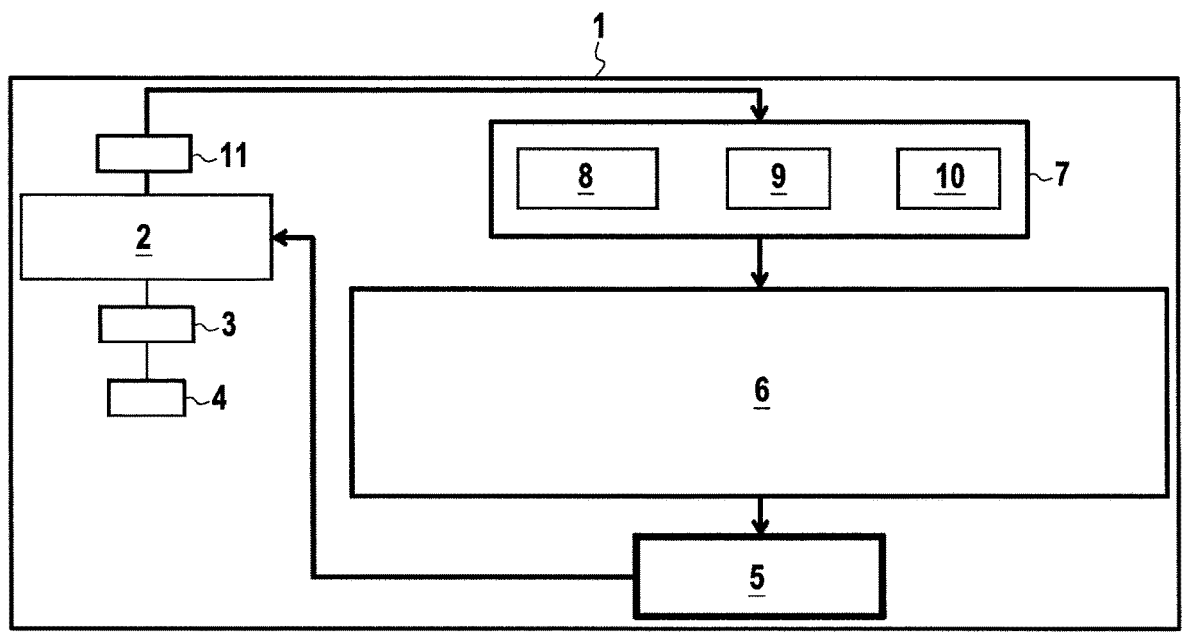
FIG. 1 shows a schematic representation of a vehicle comprising a control device according to an embodiment of the present disclosure.

FIG. 1 shows a schematic representation of a vehicle 1 comprising a control device 6 according to an embodiment of the present disclosure. The vehicle 1 may be a hybrid vehicle or an electric vehicle (i.e. a purely electrically driven vehicle). The vehicle 1 comprises at least one electric motor 4, which is powered by a battery or battery pack 2, preferably via an inverter 3. In case the vehicle is a hybrid vehicle, it further includes an internal combustion engine. The battery 2 may be a solid-state bipolar battery. However, it may also be another battery type, like a liquid type battery, as e.g. a Li-ion battery.

The battery 2 is connected to a discharging device 5 which is configured to discharge the battery 2. The discharging device 5 may comprise an electric control circuit, as e.g. a power electronics circuit. The discharging device 5 may be connected to the electric 4, in particular via the inverter 3. Accordingly, the battery 2 may be discharged, in order to operate the vehicle 1, in particular the electric motor 4. The battery 2 may further be discharged in a battery treatment and/or recovery procedure.

The discharging device may further be configured to charge the battery. For this purpose it may comprise or be connected to a connector for external charging by an external power source. The connector may be e.g. a plug or a wireless connector system. In case the vehicle is a hybrid vehicle, the discharging device 5 may further be connected to the electrical generator of the internal combustion engine of the vehicle. Consequently, the battery 2 may be charged, when the internal combustion engine is operating and/or when the vehicle is connected to an external power source.

The vehicle further comprises a dummy cell 11 which is configured to provide information, in particular measurements, based on which the charging/discharging of the battery 2 is controlled. This will be described in more detail below. The dummy cell 11 may be a further rechargeable battery, preferably of the same type as the battery 2. It may be integrated into the vehicle, e.g. it may be integrated with the control device 6. Alternatively it may be integrated with the battery 2. In the latter case the dummy cell 11 can be easily replaced together with the battery 2. For example, the battery may be realized as a battery pack comprising a plurality of cells, wherein the dummy cell is realized as a cell of the same type and may be included in the battery pack.

In order to control charging and discharging the vehicle 2 is provided with the control device 6 and sensors 7. For this purpose the control device 6 monitors the battery 2 and/or the dummy cell 2 via the sensors 7 and controls the discharging unit 5. The control device 6 and/or the sensors 7 may also be comprised by the battery 2. The control device may be an electronic control circuit (ECU). It may also comprise a data storage. It is also possible that the vehicle comprises a smart battery charging system with a smart battery and a smart charging device. In other words, both the battery and the vehicle may comprise each an ECU which operate together and form together the control device according to the disclosure. In the latter case the dummy cell 11 may be integrated in the smart battery. Furthermore the control device 6 may comprise or may be part of a battery management system.

The control device 6 may comprise an application specific integrated circuit (ASIC), an electronic circuit, a processor (shared, dedicated, or group), a combinational logic circuit, a memory that executes one or more software programs, and/or other suitable components that provide the described functionality of the control device 6.

As it will be explained in more detail in the following, the sensors 7 comprise in particular a voltage sensor 10 for measuring the open circuit voltage (OCV) of the dummy cell 11. Moreover the sensors 7 may comprise one or more temperature sensors 8 for measuring the temperature of the battery 2 and/or the dummy cell 11, at least one SOC (state of charge) sensor 9 for measuring the state of charge of the battery 2 and/or the dummy cell 11 and at least one further voltage sensor 10 for measuring the voltage of the battery 2 and/or the dummy cell 11. The SOC sensor 9 may also be a voltage sensor, wherein the measured voltage is used to determine the SOC of the battery. Of course, the SOC sensor 9 may also comprise other sensor types to determine the SOC of the battery, as it is well known in the art.

Figure 2:
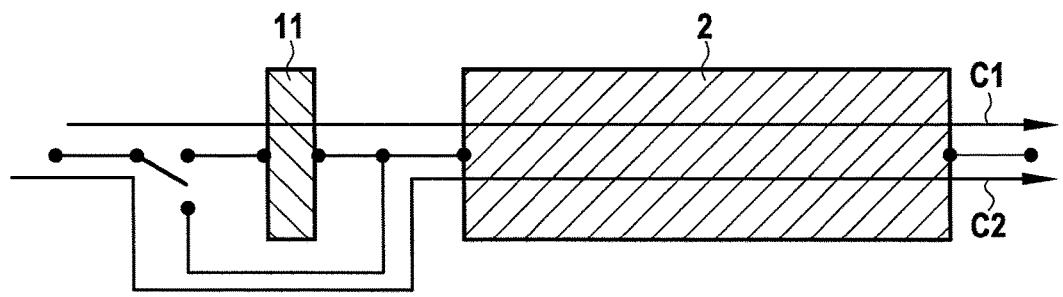
FIG. 2 shows a schematic representation of the electric circuits of the control device according to an embodiment of the present disclosure.

FIG. 2 shows a schematic representation of the electric circuits of the control device according to an embodiment of the present disclosure. The dummy cell 11 and the battery 2 are connected to a first electrical circuit C1, for example in series. This circuit C1 is configured to discharge both the dummy cell 2 and the battery 2. Preferably the circuit C1 is also configured to charge both the dummy cell 2 and the battery 2. A second circuit C2 is configured to measure the open circuit voltage $OCV_d$ of the dummy cell. In order to switch between the circuits C1 and C2, there may be provided a switch, which can be controlled by the control device 6. It is noted that FIG. 2 is a simplified diagram of the electric circuits of the control device.

Figure 3:
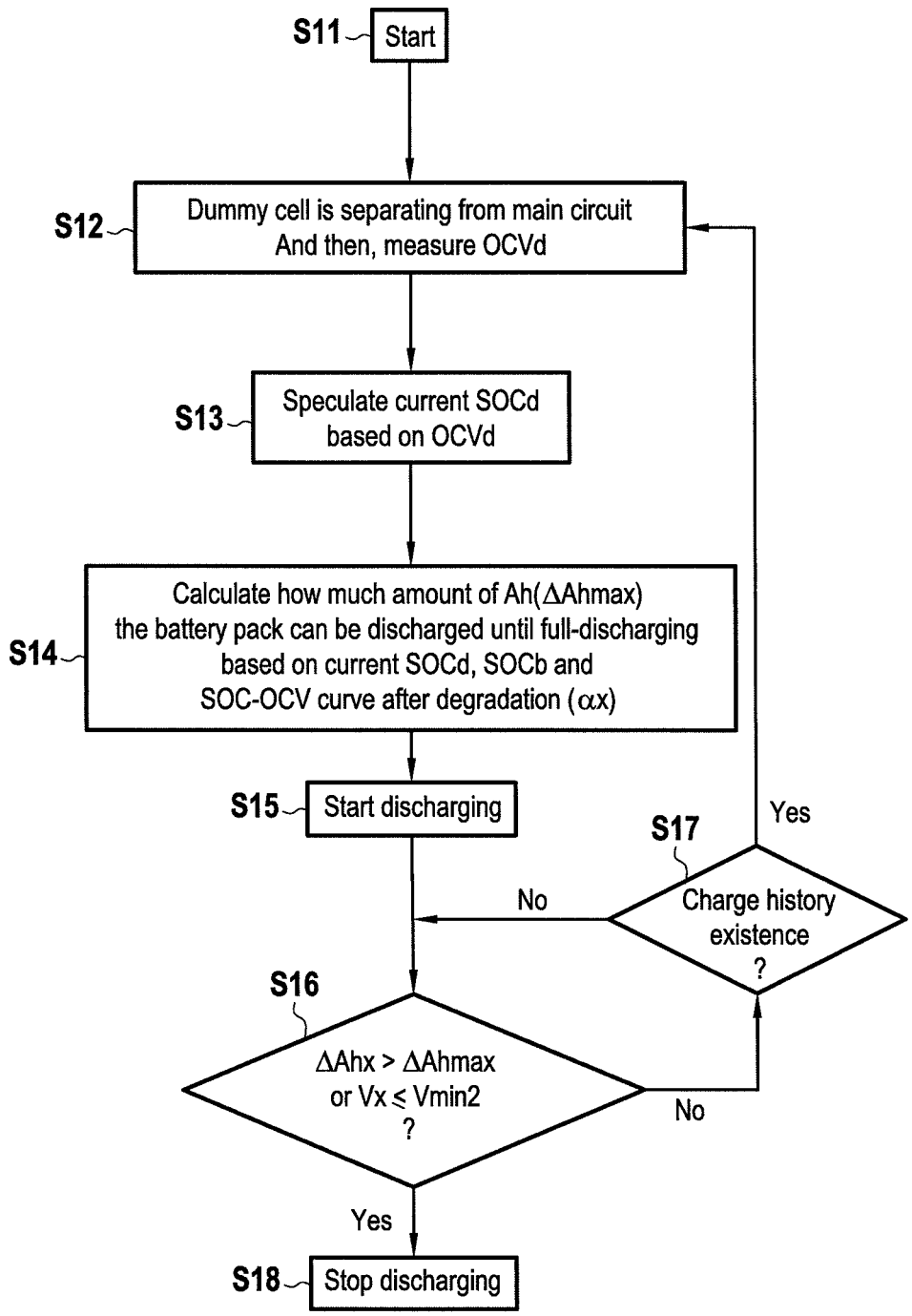
FIG. 3 shows a flow chart of the general discharging control procedure according to an embodiment of the present disclosure.

FIG. 3 shows a flow chart of the general charging control procedure according to an embodiment of the present disclosure. The control device 6 is configured to carry out this procedure of FIG. 3.

In step S11 the procedure is started. The start may be triggered by a determination of the control device that discharging of the battery is necessary (e.g. due to a requested use of the electric motor) and/or by the fact that charging becomes possible (e.g. due to a charged battery).

In step S12 the dummy cell 11 is separated from the main discharging circuit C1. In other words the control device will switch to circuit C2, in which the dummy cell 11 is separated from the circuit C1. Subsequently the open circuit voltage $OCV_d$ of the dummy cell is measured.

In step S13 the current state of charge $SOC_d$ of the dummy cell is determined based on the measured open circuit voltage of the dummy cell 11. Since this determination of $SOC_d$ may not be exact, it may also be referred to as a speculated value. In addition, the state of charge $SOC_d$ of the dummy cell is determined based the determined degradation of the dummy cell, as it will be explained in detail in context of FIG. 4.

In step S14 the maximum capacity decrement $\Delta Ah_{max}$ of the battery is determined, basically based on the open circuit voltage $OCV_d$ of dummy cell and advantageously the determined degradation $a_x$ of the dummy cell. The determined degradation $a_x$ of the dummy cell preferably corresponds to that one of the battery or has a known relationship to that one of the battery.

In particular, the maximum capacity decrement $\Delta Ah_{max}$ of the battery may be determined based on the determined state of charge $SOC_d$ of the dummy cell 11, which is determined in step S13 based on the open circuit voltage and the degradation of the dummy cell. In addition, the maximum capacity decrement $\Delta Ah_{max}$ of the battery 2 may be determined based on a predetermined SOC-OCV mapping by identifying in the $SOC_d$ value which matches to the measured $OCV_d$ value. The SOC-OCV mapping may be regularly updated based on the determined degradation $a_x$ of the dummy cell, as it will be explained in detail in context of FIG. 4. The SOC-OCV mapping may be represented by a SOC-OCV curve, as shown in FIG. 5.

More particularly, the maximum capacity decrement $\Delta Ah_{max}$ of the battery may be determined based on the state of charge $SOC_b$ of the battery, which itself is determined based on the state of charge $SOC_d$ of the dummy cell 11. In order to do so, a predetermined mapping may be used which indicates the relationship between the $SOC_d$ of the dummy cell 11 (as determined in step S13) and the $SOC_b$ of the battery. For example, the maximum capacity decrement $\Delta Ah_{max}$ of the battery may be calculated based on the difference between a predetermined lower SOC limit, e.g. 10% SOC, (determined based on the current degradation $a_x$) and the determined current $SOC_b$ (determined based on the current degradation $a_x$), i.e.

$$\Delta Ah_{max} = SOC_b(a_x) - SOC_{lower\ limit}(a_x)$$

The procedure of steps S13 to S14 preferably only takes a limited time, as e.g. 0.02 s, 0.05 s, 0.1 s, 0.2 s or 1 s.

In step S15 the discharging is started. This is done by switching to circuit C1.

In step S16 it is determined, whether the current capacity decrement $\Delta Ah_x$ of the battery exceeds the determined maximum capacity decrement $\Delta Ah_{max}$. The battery 2 is hence discharged, as long as the current capacity decrement $\Delta Ah_x$ of the battery does not exceed the determined maximum capacity decrement $\Delta Ah_{max}$. Otherwise it is determined that the battery is fully discharged and the procedure is finally stopped in step S18.

For this purpose, the current capacity decrement $\Delta Ah_x$ of the battery is monitored in step S16. Said current capacity decrement $\Delta Ah_x$ of the battery may be determined based on the monitored discharging current $I_x$ and the discharging time of the battery, in particular based on the measured discharging current $I_x$ integrated over the discharging time. Additionally or alternatively the current capacity decrement $\Delta Ah_x$ of the battery may be determined based on a previously measured open circuit voltage of the dummy cell.

Additionally in step S16 the voltage $V_x$ of the battery is measured (i.e. monitored), preferably during discharging. It is then determined, whether the measured voltage $V_x$ of the battery falls under a second predetermined lower voltage limit $V_{min2}$. If it does not, discharging is continued. However, if the measured voltage $V_x$ of the battery is lower than the second predetermined lower voltage limit $V_{min2}$, discharging is finally stopped in step S18.

The second predetermined lower voltage limit $V_{min2}$ may be chosen such that the battery can be discharged to a maximum extent without risking any dangerous discharging and low voltage of the battery. The second predetermined lower voltage limit may be determined based on the degradation of the battery. It may be smaller than a first predetermined lower voltage limit $V_{min1}$. The first predetermined lower voltage limit $V_{min1}$ may correspond to a conventional predetermined lower voltage limit known from the prior art, which corresponds to a lower SOC usage range of a new battery and does not take into account any degradation. It is also an option to decrease $V_{min1}$ by a predetermined decrement, e.g. by 0.1V, 0.2V, 0.5V, 1V or 2V, in order to obtain the second predetermined lower voltage limit $V_{min2}$. A further option is that $V_{min2}$ may be determined based on the lowest allowable SOC limit. For instance the conventional allowable usage range may be between 20% and 80% SOC. $V_{min2}$ may be determined based on an additionally decreased lower SOC limit, e.g. 5% or 10%.

Moreover it is determined in step S17, whether the battery is at the same time charged during discharging. This might be due to a consumption of electrical power stored in the battery, e.g. due to a use of the electrical motor of the vehicle. Preferably the dummy cell is configured such that it is also charged, when the battery is charged. This may be realized by circuit C1. In this way, it is possible that the dummy cell has always a state of charge which corresponds to that one of the battery.

The determination in step S17 is preferably done regularly, e.g. every 1 s, 5 s, 20 s or 1 min. In case the battery is not charged the method returns to step S16. In other words, during discharging the method runs a short loop between steps S16 and step S17.

In case it is determined in step S17 that the battery is at the same time charged during discharging, the method returns to step S12. In other words, in this case of detected charging the methods runs a long loop between steps S12 and step S17. In this way the method may again determine the maximum capacity decrement $\Delta Ah_{max}$ in step S14, as described above. By doing so the method is advantageously able to determine how much amount of capacity has been charged since the last time the maximum capacity decrement $\Delta Ah_{max}$ has been determined in step S14. Moreover it is possible to consider any further degradation of the battery, which has occurred in the meantime. Hence, the maximum capacity decrement $\Delta Ah_{max}$ may be determined again, thereby considering this further degradation.

Figure 4:
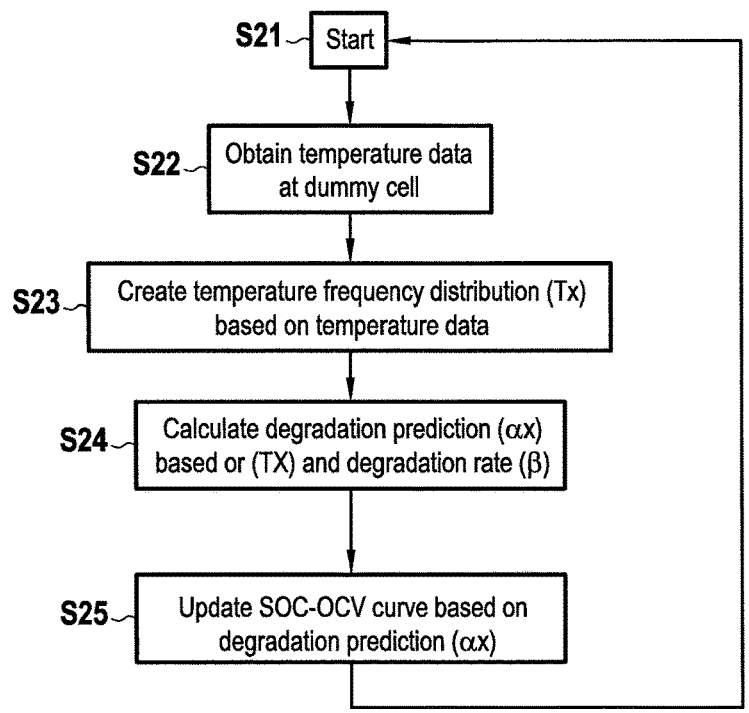
FIG. 4 shows a flow chart of the procedure for updating a SOC-OCV curve according to an embodiment of the present disclosure.
Figure 5:
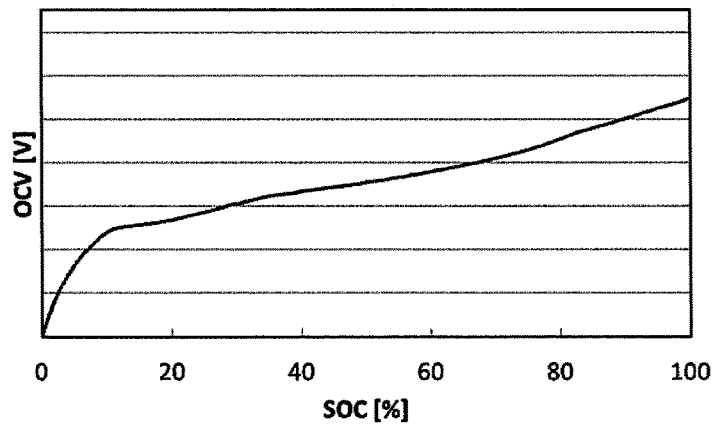
FIG. 5 shows an exemplary and schematic diagram of a SOC-OCV curve.

FIG. 4 shows a flow chart of the procedure for updating a SOC-OCV curve (i.e. a SOC-OCV mapping) according to an embodiment of the present disclosure. An exemplary and schematic diagram of a SOC-OCV curve is shown in FIG. 5.

The procedure of FIG. 4 is preferably carried out in step S13 of the procedure of FIG. 3 so that the SOC-OCV curve and hence the maximum capacity decrement $\Delta Ah_{max}$ is always determined based on a currently updated degradation $a_x$. It is noted that the determined degradation $a_x$ rather represents an estimation of the actual degradation of the battery.

In step S22 temperature data of the dummy cell are obtained. For this purpose the temperature sensor 8 may be used. However, these data may include not only the current temperature of the dummy cell, but also historic temperature data since the last time the procedure of FIG. 4 has been carried out, in particular since the last time the temperature frequency distribution $T_x$ has been updated (cf. step S23).

In step S23 the temperature frequency distribution $T_x$ is established or, in case a temperature frequency distribution $T_x$ already exists, it is updated. For this purpose the collected temperature data obtained in step S22 are accumulated, wherein the accumulated time for each measured temperature is expressed as its inverse, i.e. as frequency. The temperature frequency distribution $T_x$ is described in more detail below in context of FIG. 7.

In step S24 the degradation $a_x$ of the dummy cell is determined based on the temperature frequency distribution $T_x$ and the predetermined dummy cell specific degradation rate β, which preferably corresponds, in particular is equal, to the battery-type specific degradation rate β. This determination, i.e. calculation, is described in the following with reference to FIGS. 6 and 7.

Basically the calculation of the degradation $a_x$ is based on the Arrhenius equation, as generally known in the art. The degradation $a_x$ is calculated by $$\alpha x = c \times \exp\left(\frac{b}{T}\right) \times t$$

wherein:
t=time
c=ln(A)
b=−(E/R)
T=Temperature

The current degradation $a_x$ is thereby an accumulated value, i.e. the currently calculated degradation and the sum of all formerly calculated degradations, as e.g.:

$\alpha x1 = \alpha_1 + \alpha_2 + \alpha_3 \ldots$ with:

$$\alpha_1 = c \times \exp\left(\frac{b}{T_1}\right) \times t_1$$

Figure 7:
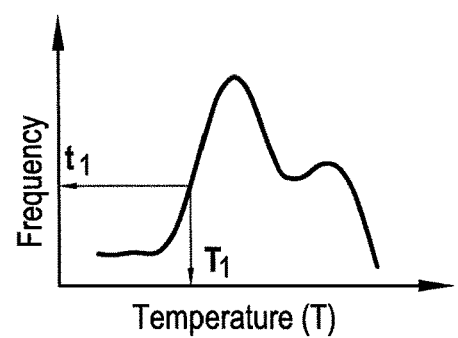
FIG. 7 shows an exemplary and schematic diagram of a determined temperature/frequency distribution of a dummy cell.

The values for the temperature T and for the time t can thereby be derived from the temperature frequency distribution $T_x$ as shown in FIG. 7. The further parameters c and b are predetermined in context of the determination of the degradation rate β.

The degradation rate β is calculated based on the equation:

$$k = A\exp\left(-\frac{E_a}{RT}\right)$$

wherein:
k=predetermined reaction rate constant (or rate constant)
A=constant
$E_a$=activation energy
R=gas constant
T=Temperature The parameters k, A, Ea and R are known by pre-experiment of the specific type of the used dummy cell, which preferably corresponds to the type of the battery, or are generally known parameters.
When k⇒β:

$$\ln(\beta) = \ln(A) - \left(\frac{E}{R}\right) \times \frac{1}{T}$$

Accordingly, the parameters b and c for the calculation of degradation $a_x$ can be determined by:

$b = -(E/R)$ $c = \ln(A)$

Figure 6:
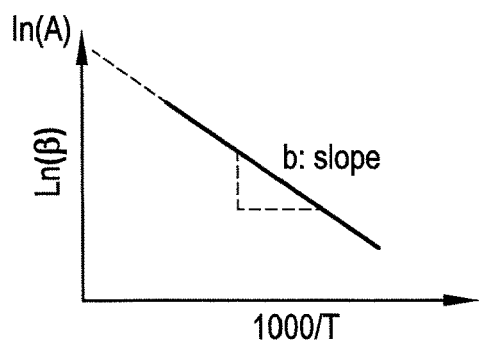
FIG. 6 shows an exemplary and schematic diagram of a predetermined degradation rate in relation to the temperature of a dummy cell.

The resulting diagram of the degradation rate β is shown in FIG. 6. The degradation rate β is predetermined and specific for the type of the used dummy cell, which preferably corresponds to the type of the battery. The degradation rate β is preferably determined in pre-experiment and is known by the battery (in case of a smart battery) and/or by the control device.

The $SOC_b$ of the battery may be mapped to the $SOC_d$ of the dummy cell, which itself is mapped (e.g. by way of the SOC-OCV mapping) to the determined degradation $a_x$ in a look-up map, i.e.:

$a_{x1} \Rightarrow SOC_{d1} \Rightarrow SOC_{b1}$ $a_{x2} \Rightarrow SOC_{d2} \Rightarrow SOC_{b2}$ $a_{x3} \Rightarrow SOC_{d3} \Rightarrow SOC_{b3}$ $a_{x4} \Rightarrow SOC_{d4} \Rightarrow SOC_{b4}$ etc.

This relation between $SOC_d$ and ax and/or between $SOC_b$ and $SOC_d$ is preferably determined in a pre-experiment and is specific for the battery-type of the used dummy cell, which preferably corresponds to the battery-type of the battery 2. The look-up map may be stored in a data storage of the control-device or of the battery (in case of a smart battery).

FIG. 5 shows an exemplary and schematic diagram of a SOC-OCV curve. As it can be seen, the OCV values are successively increasing with increasing SOC. Hence, for each OCV value a unique SOC value can be determined from the SOC-OCV curve. The SOC-OCV curve is preferably predetermined in experiments before the battery is used. During the lifetime of the battery the battery SOC-OCV curve is continuously updated, at least once per discharging procedure described in context of FIG. 3.

FIG. 6 shows an exemplary and schematic diagram of a predetermined degradation rate in relation to the temperature of a dummy cell. As it can be seen the values of the parameters b and c can be directly derived from this diagram, as b is the slope of the linear function and c is the intercept of the (elongated) linear function with the Y-axis.

FIG. 7 shows an exemplary and schematic diagram of a determined temperature/frequency distribution of a dummy cell. In the diagram the x-axis represents the temperature T of the dummy cell and the y-axis represents the frequency, i.e. the inverse of the time. The diagram contains accumulated temperature data of the dummy cell over its whole life time, i.e. over the whole time the dummy cell has been used and the rest times between the usages. In order to establish the diagram, i.e. the illustrated curve, it is determined for each temperature the dummy cell had during its life time, e.g. from −40° C. to +60° C. in (quantized) steps of 1° C., how much time the dummy cell had each of these temperatures. The accumulated time is thereby expressed by its inverse, i.e. by a frequency. Preferably, the life time of the dummy cell corresponds to that one of the battery 2. The temperature of the dummy cell should approximately correspond to that one of the battery, so that their degradation is the same. Accordingly, the dummy cell may be positioned close to the battery. Also both the dummy cell and the battery may be positioned in a case of a battery pack. This case may be equipped with a cooling fan and/or means for stabilizing the temperature of the dummy cell and the battery. Thereby, the temperature of the dummy cell and the battery can become equal.

Figure 8:
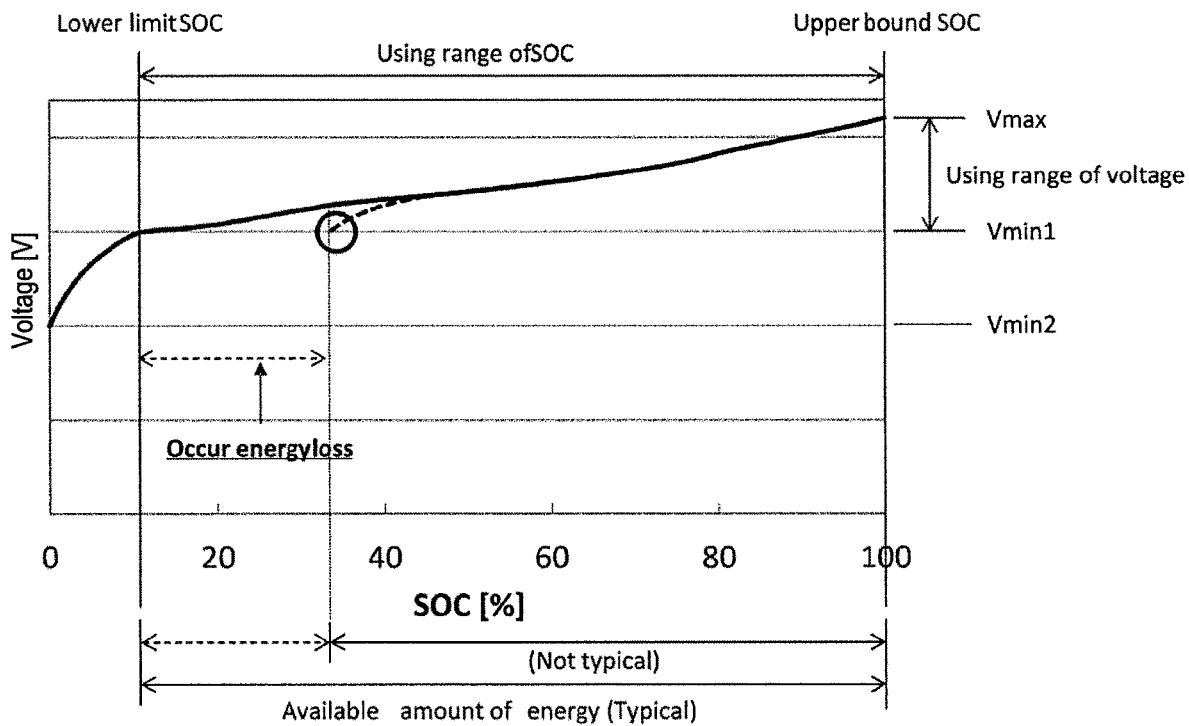
FIG. 8 shows an exemplary and schematic voltage-SOC diagram of a battery, when a conventional discharging control is applied.

FIG. 8 shows an exemplary and schematic voltage-SOC diagram of a battery, when a conventional discharging control is applied. As it can be seen the voltage V of the battery decreases during discharging, i.e. it decreases with an decreasing SOC of the battery.

The continuous line thereby represents a battery without any degradation, e.g. a new battery. The measured voltage V of such a battery reaches during discharging the conventional first lower voltage limit $V_{min1}$, when the lower limit of the SOC range is reached, e.g. at 10%. As an effect, it is correctly determined that the battery is fully discharged and discharging is stopped.

The dashed line represents a battery with lamination degradation, e.g. a used battery. The measured voltage V of such a battery decreases more strongly during discharging due to the higher resistance caused by the lamination degradation. The voltage V therefore reaches already the first lower voltage limit $V_{min1}$, when the SOC is about 35%. As an effect, it is erroneously determined that the battery is fully discharged and discharging is stopped. This can be avoided by the present disclosure as described in context of FIGS. 9 and 10.

Figure 9:
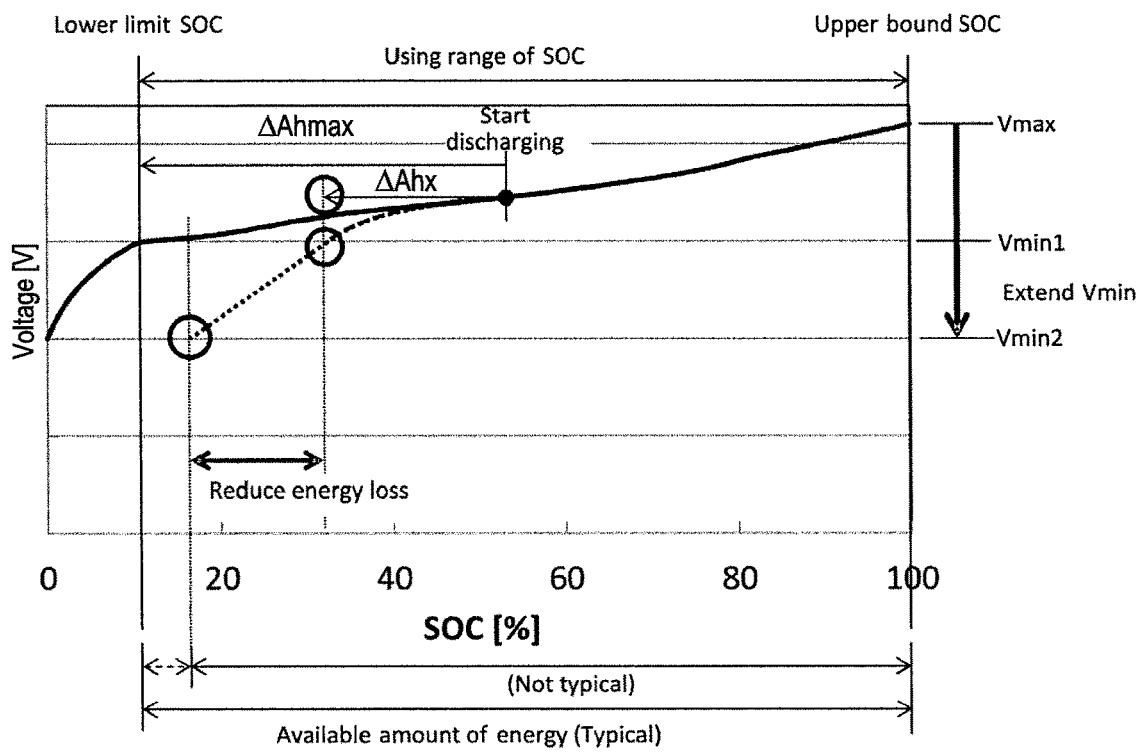
FIG. 9 shows a first exemplary and schematic voltage-SOC diagram of a battery, when a discharging control according to an embodiment of the present disclosure is applied.

FIG. 9 shows a first exemplary and schematic voltage—SOC diagram of a battery, when a discharging control according to an embodiment of the present disclosure is applied. FIG. 9 illustrates the same case as FIG. 8, i.e. a (new) battery without any degradation and a (used) battery having a lamination degradation. Both curves decrease until they reach the conventional first lower voltage limit $V_{min1}$. The dashed line representing a battery with lamination degradation thereby reaches the first lower voltage limit $V_{min1}$, when the SOC is about 35%.

However, according to the disclosure, discharging is controlled based on the capacity of the battery and not based on the conventional first lower voltage limit $V_{min1}$. Hence, discharging is not stopped, when the voltage of the battery falls under $V_{min1}$. Instead, discharging is continued until the current capacity decrement $\Delta Ah_x$ exceeds the predetermined maximum capacity decrement $\Delta Ah_{max}$ or the voltage of the battery falls under $V_{min2}$ and is only stopped at this time.

For this purpose the maximum capacity decrement $\Delta Ah_{max}$ is determined, before discharging is started, and during discharging the current capacity decrement $\Delta Ah_x$ is continuously monitored. In the present example discharging is started at a $SOC_b$ of approx. 55%. Hence, the determined maximum capacity decrement $\Delta Ah_{max}$ corresponds approx. to the remaining 45% SOC, assuming that the lower limit of the allowed SOC range is 10% SOC. When discharging is started and the voltage of the battery exceeds $V_{max}$ at 35% SOC, the current capacity decrement $\Delta Ah_x$ does not yet exceed the determined maximum capacity decrement $\Delta Ah_{max}$. Hence, discharging is continued.

However, in this example the voltage of the battery reaches the second lower voltage limit $V_{min2}$ at approx. 17% SOC. Hence, discharging is already stopped at 17% SOC, in order to avoid any critical low voltage of the battery, and not at the lower limit of the allowed SOC range, i.e. 10% SOC. $V_{min2}$ is preferably chosen to be the threshold of the critical low voltage. Anyway, by this procedure the energy loss can be reduced by 18% SOC.

Accordingly, the use of the threshold $V_{min2}$, which additionally triggers stopping discharging, serves as a security stop function.

In case it is detected during the discharging process that the battery is charged at the same time, the maximum capacity decrement $\Delta Ah_{max}$ is re-determined. Accordingly, in the example of FIG. 9, if the battery is charged e.g. by 5%, the maximum capacity decrement $\Delta Ah_{max}$ may be re-determined, in order to add these lost 5%. At the same time, any further degradation may be anticipated, when re-determining $\Delta Ah_{max}$.

Figure 10:
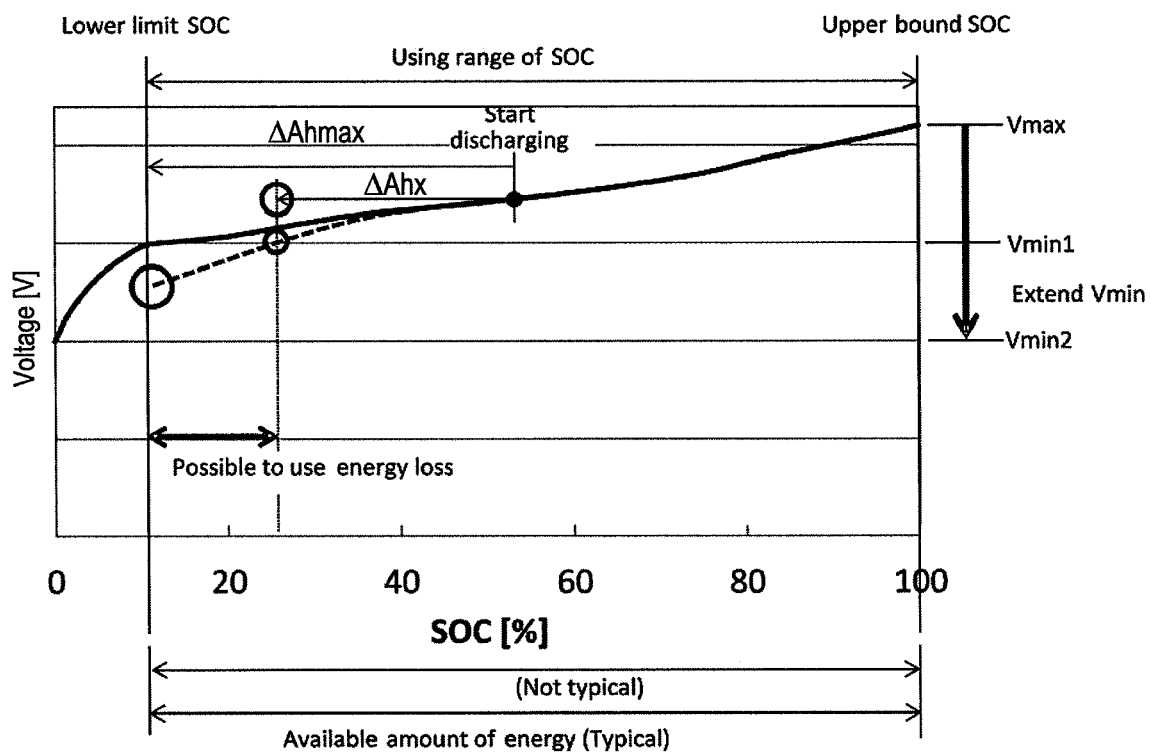
FIG. 10 shows a second exemplary and schematic voltage-SOC diagram of a battery, when a discharging control according to an embodiment of the present disclosure is applied.

FIG. 10 shows a second exemplary and schematic voltage-SOC diagram of a battery, when a discharging control according to an embodiment of the present disclosure is applied. FIG. 10 illustrates a (new) battery without any degradation and a (used) battery having a lamination degradation. Both curves decrease until they reach the initial first lower voltage limit $V_{min1}$. The dashed line representing a battery with lamination degradation thereby reaches the first lower voltage limit $V_{min1}$, when the SOC is about 35%.

However, discharging is controlled based on the capacity of the battery and not based on the conventional first lower voltage limit $V_{min1}$. Hence, discharging is continued. In the example of FIG. 10, the battery reaches the maximum capacity decrement $\Delta Ah_{max}$ approximately at 10% SOC. Hence, in this example discharging is finally stopped due to reaching the lower limit of the allowed SOC range of the battery. Accordingly, there is no energy loss due to the degradation.

Throughout the disclosure, including the claims, the term "comprising a" should be understood as being synonymous with "comprising at least one" unless otherwise stated. In addition, any range set forth in the description, including the claims should be understood as including its end value(s) unless otherwise stated. Specific values for described elements should be understood to be within accepted manufacturing or industry tolerances known to one of skill in the art, and any use of the terms "substantially" and/or "approximately" and/or "generally" should be understood to mean falling within such accepted tolerances.

Where any standards of national, international, or other standards body are referenced (e.g., ISO, etc.), such references are intended to refer to the standard as defined by the national or international standards body as of the priority date of the present specification. Any subsequent substantive changes to such standards are not intended to modify the scope and/or definitions of the present disclosure and/or claims.

Although the present disclosure herein has been described with reference to particular embodiments, it is to be understood that these embodiments are merely illustrative of the principles and applications of the present disclosure.

It is intended that the specification and examples be considered as exemplary only, with a true scope of the disclosure being indicated by the following claims.

The invention claimed is:

1. A control device for controlling discharging of a rechargeable battery, comprising:
   a rechargeable dummy cell,
   a first circuit configured to discharge the battery and the dummy cell, and
   a second circuit, configured to measure the open circuit voltage of the dummy cell,
   the control device being configured to:
   determine the open circuit voltage of the dummy cell by using the second circuit,
   determine a maximum capacity decrement of the battery based on the determined open circuit voltage of the dummy cell,
   determine, whether the battery is charged during discharging, and
   if yes, re-determine the open circuit voltage of the dummy cell and the maximum capacity decrement of the battery.

2. The control device according to claim 1, further configured to:
   discharge the battery and the dummy cell by using the first circuit,
   monitor the current capacity decrement of the battery which has been discharged and the voltage of the battery, and
   stop discharging, when the current capacity decrement of the battery exceeds the determined maximum capacity decrement or the voltage falls below a predetermined lower voltage limit.

3. The control device according to claim 1, further configured to:
   determine the current capacity decrement of the battery based on the discharging current and the discharging time of the battery, and/or based on the open circuit voltage of the dummy cell.

4. The control device according to claim 1, further configured to:
   determine the state of charge of the dummy cell based on the determined open circuit voltage of the dummy cell, and
   determine the maximum capacity decrement based on the determined state of charge of the dummy cell.

5. The control device according to claim 4, further configured to update the predetermined SOC-OCV mapping based on a determined degradation of the dummy cell.

6. The control device according to claim 5, further configured to determine the degradation of the dummy cell based on a temperature/frequency distribution of the dummy cell and a predetermined degradation rate of the dummy cell.

7. The control device according to claim 5, wherein
   the determination of the degradation of the dummy cell is based on the Arrhenius equation.

8. The control device according to claim 5, further configured to determine the temperature/frequency distribution of the dummy cell by recording for each temperature of the dummy cell how much time the dummy cell had this temperature during its lifetime.

9. The control device according to claim 4, further configured to:
   determine the state of charge of the battery based on the determined state of charge of the dummy cell and based on a predetermined mapping between the state of charge of the battery and the state of charge of the dummy cell, and
   determine the maximum capacity decrement based on the state of charge of the battery.

10. The control device according to claim 1, configured to control discharging of a battery of a specific battery type comprising a predetermined degradation rate,
    wherein the dummy cell has a degradation rate which correlates with the degradation rate of the battery.

11. The control device according to claim 1, wherein the battery of the specific battery type comprises a predetermined capacity,
    wherein the dummy cell has a capacity which correlates with the capacity of the battery.

12. The control device according to claim 1, comprising a voltage sensor for detecting the open circuit voltage of the dummy cell.

13. The control device according to claim 1, comprising a temperature sensor for detecting the temperature of the dummy cell and/or the battery.

14. A battery pack comprising:
    at least one battery, and
    a control device according to claim 1.

15. A vehicle comprising:
    an electric motor, and
    a battery pack according to claim 14.

16. A battery discharging system comprising:
    at least one battery,
    a discharging device for the battery, and
    a control device according to claim 1.

17. A vehicle comprising:
    an electric motor,
    at least one battery, and
    a control device according to claim 1.

18. A method of controlling discharging of a rechargeable battery, wherein a first circuit is used to discharge the battery and a rechargeable dummy cell, and a second circuit is used to measure the open circuit voltage of the dummy cell, the method comprising the steps of:
    determining the open circuit voltage of the dummy cell by using the second circuit,
    determining a maximum capacity decrement of the battery based on the determined open circuit voltage of the dummy cell,
    determining, whether the battery is charged during discharging, and,
    if yes, re-determining the open circuit voltage of the dummy cell and the maximum capacity decrement.

19. The method according to claim 18, further comprising the steps of:
    discharging the battery and the dummy cell by using the first circuit,
    monitoring the current capacity decrement of the battery which has been discharged and the voltage of the battery, and
    stopping discharging, when the current capacity decrement of the battery exceeds the determined maximum capacity decrement or the voltage falls below a predetermined lower voltage limit.

20. The method according to claim 18, wherein the current capacity decrement of the battery is determined based on the discharging current and the discharging time of the battery, and/or based on the open circuit voltage of the dummy cell.

21. The method according to claim 18, wherein the state of charge of the dummy cell is determined based on the determined open circuit voltage of the dummy cell, and
    the maximum capacity decrement is determined based on the determined state of charge of the dummy cell.

22. The method according to claim 21, wherein the predetermined SOC-OCV mapping is updated based on a determined degradation of the dummy cell.

23. The method according to claim 22, wherein the degradation of the battery is determined based on a temperature/frequency distribution of the dummy cell and a predetermined degradation rate of the dummy cell.

24. The method according to claim 23, wherein the temperature/frequency distribution of the dummy cell is determined by recording for each temperature of the dummy cell how much time the dummy cell had this temperature during its lifetime.

25. The method according to claim 22, wherein the determination of the degradation of the dummy cell is based on the Arrhenius equation.

26. The method according to claim 21, wherein
the state of charge of the battery is determined based on the determined state of charge of the dummy cell and based on a predetermined mapping between the state of charge of the battery and the state of charge of the dummy cell, and
the maximum capacity decrement is determined based on the state of charge of the battery.

27. A control device for controlling discharging of a rechargeable battery, comprising:
a rechargeable dummy cell,
a first circuit configured to discharge the battery and the dummy cell, and
a second circuit configured to measure the open circuit voltage of the dummy cell,
the control device being configured to:
determine the open circuit voltage of the dummy cell by using the second circuit,
determine a maximum capacity decrement of the battery based on the determined open circuit voltage of the dummy cell,
determine, whether the battery is charged during discharging, and,
if yes, re-determine the open circuit voltage of the dummy cell and the maximum capacity decrement of the battery.

* * * * *